US009018997B2

(12) United States Patent
Kim

(10) Patent No.: US 9,018,997 B2
(45) Date of Patent: Apr. 28, 2015

(54) SEMICONDUCTOR DEVICE

(71) Applicant: SK Hynix Inc., Gyeonggi-do (KR)

(72) Inventor: Bo-Yeun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/135,058

(22) Filed: Dec. 19, 2013

(65) Prior Publication Data

US 2015/0091639 A1    Apr. 2, 2015

(30) Foreign Application Priority Data

Oct. 1, 2013    (KR) .................. 10-2013-0117261

(51) Int. Cl.
H03H 11/26    (2006.01)
H03K 3/013    (2006.01)
H03K 3/012    (2006.01)

(52) U.S. Cl.
CPC ............. H03K 3/013 (2013.01); H03K 3/012 (2013.01)

(58) Field of Classification Search
USPC ........ 327/544, 565; 326/38, 41; 257/209, 529
See application file for complete search history.

(56) References Cited

U.S. PATENT DOCUMENTS

| 6,240,035 | B1 * | 5/2001 | Noda et al. ...................... 365/226 |
| 6,635,934 | B2 * | 10/2003 | Hidaka .......................... 257/369 |
| 7,557,615 | B1 * | 7/2009 | Tran et al. ....................... 326/82 |
| 7,560,976 | B2 * | 7/2009 | Choi et al. ...................... 327/534 |
| 8,253,481 | B2 * | 8/2012 | Sasaki et al. .................... 327/544 |
| 8,299,847 | B2 * | 10/2012 | Matano ........................... 327/544 |
| 8,704,410 | B2 * | 4/2014 | Nakayama et al. ............. 307/130 |
| 2003/0052712 | A1 * | 3/2003 | Comer ............................. 326/38 |
| 2009/0009238 | A1 * | 1/2009 | Ogata ............................. 327/544 |

FOREIGN PATENT DOCUMENTS

KR    1020020050927    6/2002
KR    1020130008674    1/2013

* cited by examiner

Primary Examiner — Brandon S Cole
(74) Attorney, Agent, or Firm — IP & T Group LLP

(57) ABSTRACT

A semiconductor device includes conducting lines of a first group and a second group arranged in parallel, a plurality of first internal elements respectively coupled to the conducting lines of the first group and the second group and a plurality of first contact pads arranged between and along the conducting lines of the first group and the second groups, wherein at least a part of the plurality of first contact pads are respectively coupled to control terminals of the plurality of first internal elements, and the part of the plurality of first internal elements receive a plurality of first control signals through corresponding control terminals, respectively.

19 Claims, 3 Drawing Sheets

SEMICONDUCTOR DEVICE

CROSS-REFERENCE TO RELATED APPLICATIONS

The present application claims priority of Korean Patent Application No. 10-2013-0117261, filed on Oct. 1, 2013, which is incorporated herein by reference in its entirety.

BACKGROUND

1. Field

Exemplary embodiments of the present invention relate to a semiconductor design technology, and more particularly, to a semiconductor device including a plurality of conducting lines.

2. Description of the Related Art

In general, the high integration and low power consumption of a semiconductor device has been implemented by the request of users. However, a line width and a pitch of the semiconductor are narrowed as the high integration of the semiconductor device is implemented, and an operation voltage of the semiconductor device is lowered as the semiconductor operates with a low power. Thus, a signal interference generated between signal transmission lines is getting worse, and a malfunction of the semiconductor device may be caused by the signal interference. Generally, the signal interference generated between the signal transmission lines is referred to as a crosstalk.

FIG. 1 is a diagram illustrating an exemplary crosstalk generated between signal lines of a semiconductor device.

Referring to FIG. 1, the semiconductor device includes a plurality of signal lines LINE0 to LINE3 for transmitting a plurality of signals.

The plurality of signal lines LINE0 to LINE3 are arranged, for example, in parallel along a length direction. Since the plurality of signal lines LINE0 to LINE3 are conducting lines, a parasitic capacitor is generated between the signal lines LINE0 to LINE3 and a capacitance of the parasitic capacitor varies depending on disposition of the signal lines LINE0 to LINE3. For example, when a capacitance of a parasitic capacitor generated between the first signal line LINE0 and the second signal line LINE1 is "A*Ct", a capacitance of a parasitic capacitor generated between the second signal line LINE1 and the third signal line LINE2 is "B*Ct" and a capacitance of a parasitic capacitor generated between the third signal line LINE2 and the fourth signal line LINE3 is "C*Ct" where A, B, and C are coefficients, each capacitance reflected on the second signal line LINE1 and the third signal line LINE2 is greater than each capacitance reflected on the first signal line LINE0 and the fourth signal line LINE3, as shown in table 1 below.

TABLE 1

| Signal Line | Capacitance of Signal Line | Capacitance (assumption: $A = B = C = k$) |
| --- | --- | --- |
| LINE0 | $A * Ct$ | $1k * Ct$ |
| LINE1 | $(A + B) * Ct$ | $2k * Ct$ |
| LINE2 | $(B + C) * Ct$ | $3k * Ct$ |
| LINE3 | $C * Ct$ | $1k * Ct$ |

In conclusion, the signal interference, which should be prevented, is increased as the capacitance reflected on the signal lines LINE0 to LINE3 is increased.

SUMMARY

Exemplary embodiments of the present invention are directed to a semiconductor device for reducing a signal interference generated between signal lines by using internal contact pads, which are arranged in a peripheral region of the signal lines, as shielding lines.

The semiconductor device may prevent a malfunction caused by parasitic capacitance reflected on the signal lines.

In accordance with an embodiment of the present invention, a semiconductor device may include conducting lines of a first group and a second group arranged in parallel, a plurality of first internal elements respectively coupled to the conducting lines of the first group and the second group and a plurality of first contact pads arranged between and along the conducting lines of the first group and the second groups, wherein at least a part of the plurality of first contact pads are respectively coupled to control terminals of the plurality of first internal elements, and the part of the plurality of first internal elements receive a plurality of first control signals through corresponding control terminals, respectively.

In accordance with another embodiment of the present invention, a semiconductor device may include first and second data lines arranged in parallel in a first region, third and fourth data lines arranged in parallel with the first and second data lines in a second region, a plurality of switching units suitable for selectively providing electrical connection to the first to fourth data lines and a plurality of contact pads arranged between and along the first region and the second region and coupled to control terminals of the plurality of switching units, wherein at least a part of the plurality of switching units receive a plurality of control signals through corresponding control terminals, respectively.

In accordance with another embodiment of the present invention, a semiconductor device may include first and second data lines arranged in parallel along a length direction, a plurality of third and fourth data lines arranged in parallel along the length direction, a plurality of first switching unit suitable for selectively coupling the first data line to the plurality of third data lines in response to a plurality of control signals, a plurality of second switching unit suitable for selectively coupling the second data to the plurality of fourth data lines in response to the plurality of control signals, fifth and sixth data lines arranged in parallel with the first and second data lines, a plurality of seventh and eighth data lines arranged in parallel with the plurality of third and fourth data lines, a plurality of third switching unit suitable for selectively coupling the fifth data line to the plurality of seventh data lines in response to the plurality of control signals, a plurality of fourth switching unit suitable for selectively coupling the sixth data line to the plurality of eighth data lines in response to the plurality of control signals, a plurality of contact pads arranged between a first region and a second region along a length direction of the first and second data lines, and coupled to a control terminal of the plurality of first to fourth switching units, wherein the first region includes the first and second data lines, the second region includes the fifth and sixth data lines, and the control terminal receives the plurality of control signals.

DETAILED DESCRIPTION

Figure 1:
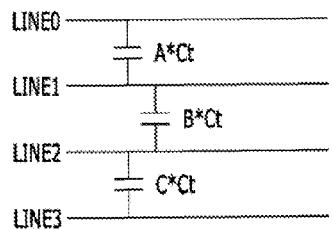
FIG. 1 is a diagram illustrating an exemplary crosstalk generated between signal lines of a semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form as long as it is not specifically mentioned in a sentence. Furthermore, 'include/comprise' or 'including/comprising' used in the specification represents that one or more components, steps, operations, and elements exists or are added.

A semiconductor device such as dynamic random access memory (DRAM) is exemplarily illustrated in the present invention. Eight segment lines are exemplarily arranged in the present invention.

Figure 2:
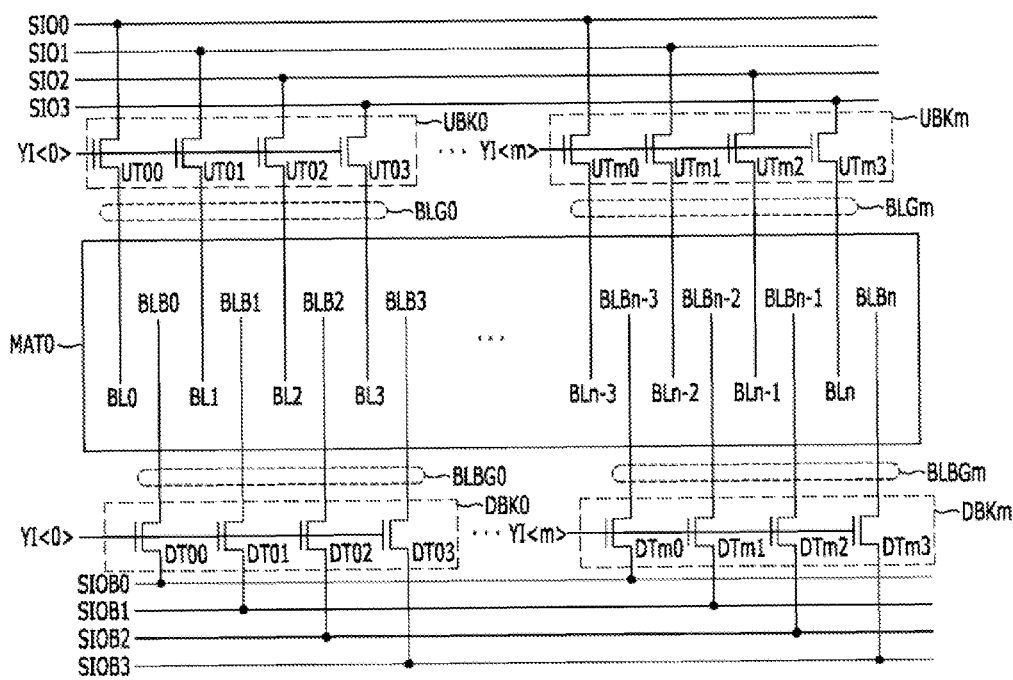
FIG. 2 is a circuit diagram illustrating a semiconductor device in accordance with an exemplary embodiment of the present invention.

FIG. 2 is a circuit diagram illustrating a semiconductor device in accordance with an exemplary embodiment of the present invention.

Referring to FIG. 2, a semiconductor device includes first to fourth positive segment lines SIO0 to SIO3, a plurality of positive bit line groups BLG0 to BLGm, a plurality of upper switching blocks UBK0 to UBKm, first to fourth negative segment lines SIOB0 to SIOB3, a plurality of negative bit line groups BLBG0 to BLBGm, a plurality of lower switching blocks DBK0 to DKBm and a first mat MAT0.

The first to fourth positive segment lines SIO0 to SOI3 may be in parallel, for example, along a row direction.

Each of the plurality of positive bit line groups BLG0 to BLGm may be disposed in parallel, for example, along a column direction and include four positive bit lines BL0 to BL3, . . . , BLn−3 to BLn corresponding to the first to fourth positive segment lines SIO0 to SIO3, respectively.

The plurality of upper switching blocks UBK0 to UBKm may selectively couple the first to fourth positive segment lines SIO0 to SIO3 to one of the plurality of positive bit line groups BLG0 to BLGm. In response to a plurality of column selection signal YI<0> to YI<m>.

Each of the plurality of upper switching blocks UBK0 to UBKm may include four first switching elements UT00 to UT03, . . . , UTm0 to UTm3 for coupling each of the first to fourth positive segment lines SIO0 to SIO3 to corresponding one of the four positive bit lines, for example, BL0 to BL3 included in one of the plurality of positive bit line groups BLG0 to BLGm in response to the plurality of column selection signal YI<0> to YI<m>, which may be selectively activated when a read operation or a write operation is performed. The first switching elements UT00 to UT03, . . . , UTm0 to UTm3 may include NMOS transistors.

The first to fourth negative segment lines SIOB0 to SIOB3 may be disposed in parallel, for example, along a row direction.

Each of the plurality of negative bit line groups BLBG0 to BLBGm may be disposed in parallel, for example, along a column direction and include four negative bit lines BLB0 to BLB3, . . . , BLBn−3 to BLBn corresponding to the first to fourth negative segment lines SIOB0 to SIOB3, respectively.

The plurality of lower switching blocks DBK0 to DBKm may selectively couple the first to fourth negative segment lines SIOB0 to SIOB3 to one of the plurality of negative bit line groups BLBG0 to BLBGm in response to the plurality of column selection signal YI<0> to YI<m>.

Each of the plurality of lower switching blocks DBK0 to DKBm may include four second switching elements DT00 to DT03, . . . , DTm0 to DTm3 for coupling each of the first to fourth negative segment lines SIOB0 to SIOB3 to corresponding one of the four negative bit lines, for example, BLB0 to BLB3 included in one of the plurality of negative bit line groups BLBG0 to BLBGm in response to the plurality of column selection signal YI<0> to YI<m>, which may be selectively activated when a read operation or a write operation is performed. The second switching elements DT00 to DT03, . . . , DTm0 to DTm3 may include NMOS transistors.

The first mat MAT0 is disposed between an upper region where the first to fourth positive segment lines SIO0 to SIO3 are disposed and a lower region where the first to fourth negative segment lines SIOB0 to SIOB3 are disposed. The mat MAT0 may be coupled to the plurality of the positive bit line groups BLG0 to BLGm and the plurality of negative bit line groups BLBG0 to BLBG3.

The first mat MAT0 may include a plurality of memory cells (not shown). During a read operation, the first mat MAT0 may read stored data from the plurality of memory cells and may provide the read data to the plurality of positive bit line groups BLG0 to BLGm and the plurality of negative bit line groups BLBG0 to BLBGm. During a write operation, the first mat MAT0 writes the data, which is provided through the plurality of positive bit lines BLG0 to BLGm and the plurality of negative bit lines BLBG0 to BLBGm, on the memory cell.

Figure 3:
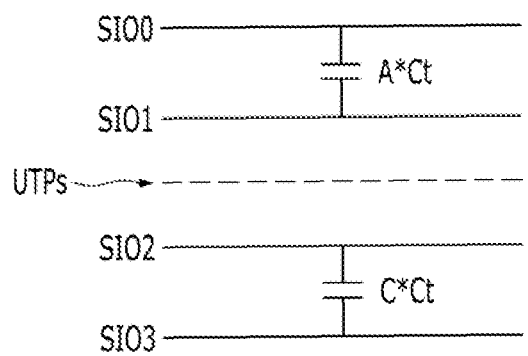
FIG. 3 is an exemplary detailed diagram illustrating an upper region shown in FIG. 2.

FIG. 3 is an exemplary detailed diagram illustrating the upper region shown in FIG. 2.

Referring to FIG. 3, a semiconductor device may include a plurality of first contact pads UTPs arranged between a first upper region where the first and the second positive segment lines SIO0 and SIO1 are disposed, and a second upper region where the third and the fourth positive segment lines SIO2 and SIO3 are disposed.

For example, the plurality of first contact pads UTPs may be arranged along a length direction of the first to fourth positive segment lines SIO0 to SIO3 and serve as a shielding line between the second segment line SIO1 in the first upper region and the third segment line SIO2 in the second upper region.

The plurality of first contact pads UTPs may be coupled to control terminals of the plurality of first switching elements UT00 to UT03, . . . , UTm0 to UTm3 shown in FIG. 2. The control terminals of the plurality of first switching elements UT00 to UT03, . . . , UTm0 to UTm3 indicate terminal, e.g., gate terminals of NMOS transistors, which receive the plurality of column selection signals YI<0> to YI<m>.

A shielding line is biased to a ground voltage and thus the plurality of first contact pads UTPs, which are coupled to the control terminals of the plurality of first switching elements UT00 to UT03, . . . , UTm0 to UTm3, may be biased to the ground voltage by receiving the plurality of column selection signals YI<0> to YI<m>. For reference, the plurality of column selection signals YI<0> to YI<m> may maintain a logic low level corresponding to the ground voltage when the plurality of column selection signals YI<0> to YI<m> are inactivated. The plurality of column selection signals YI<0> to YI<m> may maintain a logic high level corresponding to the power supply voltage when the plurality of column selection signals YI<0> to YI<m> are activated. When a read operation or a write operation is performed, one of the plurality of column selection signals YI<0> to YI<m> may be activated. Thus, although one of the plurality column selection signals YI<0> to YI<m> may be activated, the plurality of first contact pads UTPs may serve as the shielding line by other inactivated column selection signals.

As described above, when the plurality of first contact pads UTPs may be arranged between the first upper region and the second upper region, a parasitic capacitance generated in-between the first to fourth positive segment lines SIO0 to SIO3 may be described in table 2 below. The first upper region may include the first positive segment line SIO0 and the second positive segment line SIO1. The second upper region may include the third positive segment line SIO2 and the fourth positive segment line SIO3.

TABLE 2

| Signal Line | Capacitance reflected on the Signal Line | Capacitance (assumption: A = B = C = k) |
| --- | --- | --- |
| SIO0 | A * Ct | 1k * Ct |
| SIO1 | A * Ct | 1k * Ct |
| SIO2 | C * Ct | 1k * Ct |
| SIO3 | C * Ct | 1k * Ct |

Figure 4:
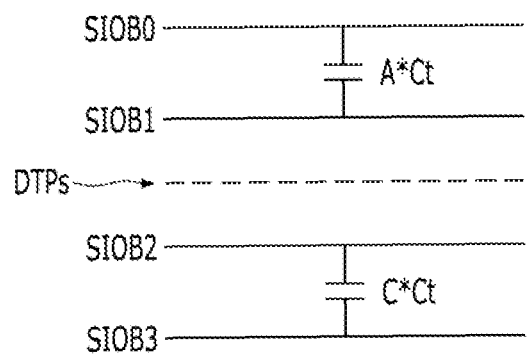
FIG. 4 is an exemplary detailed diagram illustrating a lower region shown in FIG. 2.

FIG. 4 is an exemplary detailed diagram illustrating the lower region shown in FIG. 2.

Referring to FIG. 4, the semiconductor device may include a plurality of second contact pads DTPs between a first lower region and a second lower region. In the first lower region, the first negative segment line SIOB0 and the second negative segment line SIOB1 may be disposed. In the second lower region, the third segment line SIOB2 and the fourth segment line SIOB3 may be disposed.

For example, the plurality of second contact pads DTPs may be to arranged along a length direction of the first to fourth negative segment lines SIOB0 to SIOB3 and serve as a shielding line between the second segment line SIOB1 in the first lower region and the third segment line SIOB2 in the second lower region.

The plurality of second contact pads DTPs may be coupled to control terminals of the plurality of second switching elements DT00 to DT03, . . . , DTm0 to DTm3 shown in FIG. 2.

The configuration of the lower region is the same as the upper region. Although one of the plurality column selection signals YI<O> to YI<m> may be activated, the plurality of second contact pads DTPs may serve as the shielding line by other inactivated column selection signals. When the plurality of second contact pads DTPs may be arranged between the first lower region and the second lower region, a parasitic capacitance generated in-between the first to fourth negative segment lines SIOB0 to SIOB3 may be similar to table 2 above.

Hereinafter, an exemplary operation of a semiconductor device in accordance with an embodiment of the present invention will be described with reference to FIG. 5.

Figure 5:
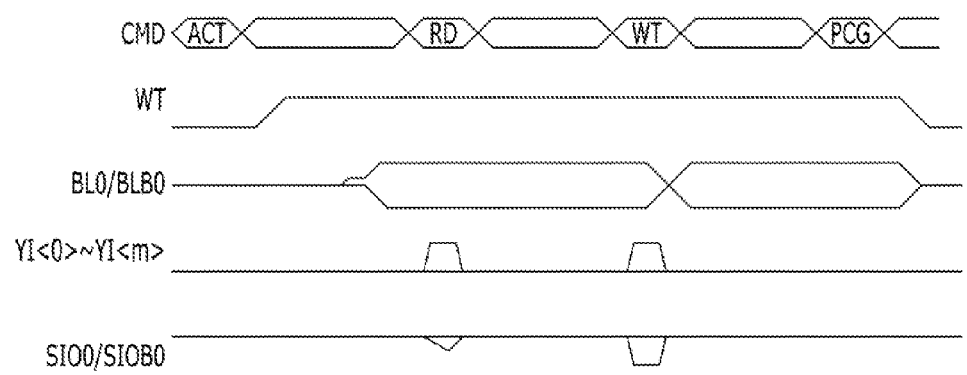
FIG. 5 is a timing diagram illustrating an operation of a semiconductor device in accordance with an exemplary embodiment of the present invention.

FIG. 5 is a timing diagram illustrating an operation of a semiconductor device in accordance with an exemplary embodiment of the present invention.

Referring to FIGS. 2 and 5, the semiconductor device may perform an active operation in response to an active command ACT. For example, the active operation may include steps of decoding a row address (not shown), selecting a word line, transmitting the data on a memory cell coupled to the selected word line to one of the plurality of positive bit line groups BLG0 to BLGm and corresponding one of the plurality of negative bit line groups GLBG0 to BLBGm through charge sharing and sensing and amplifying the data on the pair of positive and negative bit lines, for example, BL0/BLB0 by a bit line sense amplifier (not shown). The active operation precedes a read operation or a write operation is performed.

The semiconductor device may perform the read operation in response to a read command RD. When one of the plurality of column selection signals YI<0> to YI<m> is activated according to the read operation, the first to fourth positive segment lines SIO0 to SIO3 may be coupled to one of the plurality of positive bit line groups BLG0 to BLGm through one of the plurality of upper switching blocks UBK0 to UBKm and the first to fourth negative segment lines SIOB0 to SIOB3 may be coupled to one of the plurality of negative bit line groups BLBG0 to BLBGm through one of the plurality of lower switching blocks DBK0 to DBKm.

For example, when the first column selection signal YI<0> is activated, the four first switching elements UT01 to UT03 included in the first upper switching blocks UBK0 may couple the first to fourth positive segment lines SIO0 to SIO3 to four positive bit lines BL0 to BL3 included in the first positive bit line group BLG0 and the four second switching elements DT01 to DT03 included in a first lower switching blocks DBK0 may couple the first to fourth negative segment lines SIOB0 to SIOB3 to four negative bit lines BLB0 to BLB3 included in the first negative bit line group BLBG0.

The read data on the selected positive bit line group and the selected negative bit line group may be transmitted to the first to fourth positive segment lines SIO0 to SIO3 and the first to fourth negative segment lines SIOB0 to SIOB3, respectively. For example, the read data on the first positive bit line group BLG0 and the first negative bit line group BLBG0 may be transmitted to the first to fourth positive segment lines SIO0 to SIO3 and the first to fourth negative segment lines SIOB0 to SIOB3, respectively.

When the read data are transmitted through the first to fourth positive segment lines SIO0 to SIO3 and the first to fourth negative segment lines SIOB0 to SIOB3, the plurality of first contact pads UTPs and the plurality of second contact pads DTPs may serve as the shielding lines since the plurality of first contact pads UTPs and the plurality of second contact pads DTPs may be biased to the ground voltage in response to the inactivated plurality of column selection signals YI<1> to YI<m> having a logic low level.

When the read data may be transmitted, some of the plurality of first contact pads UTPs and the plurality of second contact pads DTPs may be biased to the power supply voltage by the activated column selection signal, for example, YI<0>, having a logic high level. However, the number of some of the plurality of first contact pads UTPs and the plurality of second contact pads DTPs, which are biased to the power supply voltage, is much smaller than the number of the other first and second contact pads UTPs and DTPs, which are biased to the ground voltage, and thus the influence of some of the plurality of first contact pads UTPs and the plurality of second contact pads DTPs, which are biased to the power supply voltage, may be negligible. Thus, when the read data may be transmitted through the first to fourth positive segment lines SIO0 to SIO3 and the first to fourth segment lines SIOB0 to SIOB3, the interference between the transmission signals, e.g., the transmitted read data, may be minimized as much as the reduced capacitance shown in table 2.

Subsequently, the semiconductor device may perform the write operation in response to a write command WT. When one of the plurality of column selection signals YI<0> to YI<m> is activated according to the write operation, the first to fourth positive segment lines SIO0 to SIO3 may be coupled to one of the plurality of positive bit line groups BLG0 to BLGm through one of the plurality of upper switching blocks UBK0 to UBKm and the first to fourth negative segment lines SIOB0 to SIOB3 may be coupled to one of the plurality of negative bit line groups BLBG0 to BLBGm through one of the plurality of lower switching blocks DBK0 to DBKm.

For example, when the first column selection signal YI<0> is activated, the four first switching elements UT01 to UT03 included in the first upper switching blocks UBK0 may couple the first to fourth positive segment lines SIO0 to SIO3 to four positive bit lines BL0 to BL3 included in the first positive bit line group BLG0 and the four second switching elements DT01 to DT03 included in a first lower switching blocks DBK0 may couple the first to fourth negative segment lines SIOB0 to SIOB3 to four negative bit lines BLB0 to BLB3 included in the first negative bit line group BLBG0.

The write data on the first to fourth positive segment lines SIO0 to SIO3 and the first to fourth negative segment lines SIOB0 to SIOB3 may be transmitted to the selected positive bit line group and a selected negative bit line group, respectively. For example, the write data on the first to fourth positive segment lines SIO0 to SIO3 and the first to fourth negative segment lines SIOB0 to SIOB3 may be transmitted to the first positive bit line group BLG0 to the first negative bit line group BLBG0, respectively.

When the write data may be transmitted through the first to fourth positive segment lines SIO0 to SIO3 and the first to fourth negative segment lines SIOB0 to SIOB3, the plurality of first contact pads UTPs and the plurality of second contact pads DTPs may serve as the shielding lines since the plurality of first contact pads UTPs and the plurality of second contact pads DTPs may be biased to the ground voltage in response to the inactivated plurality of column selection signals YI<1> to YI<m> having a logic low level.

When the write data may be transmitted, some of the plurality of first contact pads UTPs and the plurality of second contact pads DTPs may be biased to the power supply voltage by the activated column selection signal, for example, YI<0>, having a logic high level. However, the number of some of the plurality of first contact pads UTPs and the plurality of second contact pads DTPs, which are biased to the power supply voltage, is much smaller than the number of the other first and second contact pads UTPs and DTPs, which are biased to the ground voltage, and thus the influence of some of the plurality of first contact pads UTPs and the plurality of second contact pads DTPs, which are biased to the power supply voltage, may be negligible. Thus, when the write data may be transmitted through the first to fourth positive segment lines SIO0 to SIO3 and the first to fourth segment lines SIOB0 to SIOB3, the interference between the transmission signals, e.g., the transmitted read data, may be minimized as shown in the table 2.

The semiconductor device in accordance with an exemplary embodiment of the present invention may implement a shielding line without expanding an area by arranging the plurality of contact pads between the plurality of segment lines without additionally arranging a shielding line for the plurality of segment lines.

While the present invention has been described with respect to the specific embodiments, it will be apparent to those skilled in the art that various changes and modifications may be made without departing from the spirit and scope of the invention as defined in the following claims.

For example, the plurality of contact pads may serve as the shielding lines in the description, but a conducting line, which is biased to a ground voltage during a signal transmission period, also may serve as a shielding line in accordance with an embodiment of the present invention.

What is claimed is:

1. A semiconductor device, comprising:
   conducting lines of a first group and a second group arranged in parallel with each other;
   a plurality of first internal elements respectively coupled to conducting lines of the first group and the second group; and
   a plurality of first contact pads arranged between the conducting lines of the first group and the conducting lines of the second group, and arranged in parallel along a length direction of the conducting lines of the first group and the second group,
   wherein at least a part of the plurality of first contact pads are respectively coupled to control terminals of the plurality of first internal elements, and
   the part of the plurality of first internal elements receive a plurality of first control signals through corresponding control terminals, respectively.

2. The semiconductor device of claim 1, wherein when some of the plurality of first contact pads are biased to a ground voltage by corresponding ones of the plurality of first control signals during electrical communication through one or more conducting lines of the first group and second group, the plurality of first contact pads serve as shielding lines.

3. The semiconductor device of claim 1, wherein the first internal element is a first transistor and the control terminal is a gate terminal of the first transistor.

4. The semiconductor device of claim 1, further comprising:
   conducting lines of a third group and a fourth group arranged in parallel;
   a plurality of second internal elements respectively coupled to the conducting lines of the third group and the fourth group; and
   a plurality of second contact pads arranged between and along the conducting lines of the third group and the fourth group,
   wherein at least a part of the plurality of second contact pads are respectively coupled to control terminals of the plurality of second internal elements, and
   the part of the plurality of second internal elements receive a plurality of second control signals through corresponding control terminals, respectively.

5. The semiconductor device of claim 4, wherein a majority of the plurality of second contact pads are biased to the ground voltage by corresponding ones of the plurality of second control signals during electrical communication through one or more conducting lines of the third group and fourth group.

6. The semiconductor device of claim 4, wherein the second internal element is a second transistor and the control terminal is a gate terminal of the second transistor.

7. The semiconductor device of claim 4, wherein the plurality of second control signals are the same as the plurality of first control signals, respectively.

8. The semiconductor device of claim 4, wherein the first group, the second group, the third group, the fourth group, the plurality of first contact pads, and the plurality of second contact pads are arranged in parallel along a length direction.

9. The semiconductor device of claim 4, wherein each of the first group, the second group, the third group, and the fourth group include one or more conducting lines.

10. The semiconductor device of claim 1, wherein the conducting lines of the first group and the second group are adjacently disposed enough to generate parasitic capacitance therebetween.

11. The semiconductor device of claim 4, wherein the conducting lines of the third group and the fourth group are adjacently disposed enough to generate parasitic capacitance therebetween.

12. A semiconductor device, comprising:
first and second data lines arranged in parallel in a first region;
third and fourth data lines arranged in parallel with the first and second data lines in a second region;
a plurality of switching units suitable for selectively providing electrical connection to the first to fourth data lines; and
a plurality of contact pads arranged between the first region and the second region, arranged in parallel along a length direction of the first region and the second region and coupled to control terminals of the plurality of switching units,
wherein at least a part of the plurality of switching units receive a plurality of control signals through corresponding control terminals, respectively.

13. The semiconductor device of claim 12, wherein each of the first to fourth data lines include a segment line and the plurality of control signals include a plurality of column selection signals, which are selectively activated.

14. The semiconductor device of claim 13, wherein the plurality of column selection signals maintain a ground voltage level in response to inactivation of the plurality of column selection signals.

15. The semiconductor device of claim 14, wherein the switching units is a transistor and the control terminal is a gate terminal of the transistor.

16. A semiconductor device, comprising:
first and second data lines arranged in parallel along a length direction;
a plurality of third and fourth data lines arranged in parallel along the length direction;
a plurality of first switching unit suitable for selectively coupling the first data line to the plurality of third data lines in response to a plurality of control signals;
a plurality of second switching unit suitable for selectively coupling the second data to the plurality of fourth data lines in response to the plurality of control signals;
fifth and sixth data lines arranged in parallel with the first and second data lines;
a plurality of seventh and eighth data lines arranged in parallel with the plurality of third and fourth data lines;
a plurality of third switching unit suitable for selectively coupling the fifth data line to the plurality of seventh data lines in response to the plurality of control signals;
a plurality of fourth switching unit suitable for selectively coupling the sixth data line to the plurality of eighth data lines in response to the plurality of control signals;
a plurality of contact pads arranged between a first region and a second region along a length direction of the first and second data lines, and coupled to a control terminal of the plurality of first to fourth switching units,
wherein the first region includes the first and second data lines, the second region includes the fifth and sixth data lines, and the control terminal receives the plurality of control signals.

17. The semiconductor device of claim 16, wherein each of the first and second data lines and the fifth and sixth data lines includes a segment line, each of the plurality of third and fourth data lines and the plurality of seventh and eighth data lines includes a bit line, and the plurality of control signals include a plurality of column selection signals, which are selectively activated.

18. The semiconductor device of claim 17, wherein if the plurality of column selection signals are inactivated, the plurality of column selection signals maintain a ground voltage level.

19. The semiconductor device of claim 16, wherein the plurality of first to fourth switching units include a plurality of transistors of which each gate receives the plurality of control signals through the plurality of contact pads.

* * * * *